United States Patent
Joshi et al.

(10) Patent No.: US 11,061,056 B2
(45) Date of Patent: Jul. 13, 2021

(54) VOLTAGE RATING VALIDATOR FOR ADVANCED METERING

(71) Applicant: Landis+Gyr Innovations, Inc., Alpharetta, GA (US)

(72) Inventors: Vivek Joshi, Alpharetta, GA (US); Umang Deora, Alpharetta, GA (US)

(73) Assignee: Landis+Gyr Innovations, Inc., Alpharetta, GA (US)

(*) Notice: Subject to any disclaimer, the term of this patent is extended or adjusted under 35 U.S.C. 154(b) by 227 days.

(21) Appl. No.: 16/271,929

(22) Filed: Feb. 11, 2019

(65) Prior Publication Data
US 2020/0256903 A1 Aug. 13, 2020

(51) Int. Cl.
*G01R 22/06* (2006.01)

(52) U.S. Cl.
CPC .................. *G01R 22/068* (2013.01)

(58) Field of Classification Search
CPC .... G01R 22/068; G01R 22/06; G01R 22/063; G01R 22/066; G01R 22/10; G01R 19/0084; G01R 35/04
See application file for complete search history.

(56) References Cited

U.S. PATENT DOCUMENTS

| | | | | |
|---|---|---|---|---|
| 5,631,554 A * | 5/1997 | Briese | ............... | G01R 35/04 324/76.77 |
| 6,094,622 A * | 7/2000 | Hubbard | ............... | G01R 21/133 702/61 |
| 6,112,158 A * | 8/2000 | Bond | ............... | G06Q 50/06 702/61 |
| 6,141,626 A * | 10/2000 | Holdsclaw | ............... | G01R 22/00 324/76.11 |
| 6,629,046 B1 * | 9/2003 | Bond | ............... | G06Q 50/06 702/61 |
| 2018/0356449 A1 * | 12/2018 | Leonard | ............... | G01R 19/003 |

* cited by examiner

*Primary Examiner* — Lee E Rodak
(74) *Attorney, Agent, or Firm* — Kilpatrick Townsend & Stockton LLP (57) ABSTRACT

Systems and methods for determining a voltage meter rating for a utility meter connected to a distribution system via one or more distribution lines. The system accesses voltage measurements provided by a meter that represent a voltage at different time intervals. The system filters the voltage measurements to remove any voltage measurements that fall outside a voltage range for the distribution line. The system further determines a measured voltage rating from a set of candidate voltage ratings for the meter. The system compares a stored voltage rating for the meter and the measured voltage rating to determine a confidence level for the measured voltage rating. When the confidence level for measured voltage rating exceeds a confidence threshold, the system uses the measured voltage rating to maintain the distribution system.

20 Claims, 6 Drawing Sheets

VOLTAGE RATING VALIDATOR FOR ADVANCED METERING

TECHNICAL FIELD

This invention relates to monitoring electrical power distribution systems. For example, certain aspects validate ratings of metering devices in a distribution system by using advanced metering data.

BACKGROUND

Electricity is delivered through a distribution network that connects a generation system, e.g., a power generator and a transmission system, to end users such as consumers or businesses. Requirements may dictate that utility companies maintain an accurate inventory of meter ratings. For example, a voltage meter may be measuring voltages on a 240 Volt circuit but be incorrectly identified in a central system as rated for 400-600 Volts. Consequently, a central system may take an erroneous action based on the incorrect rating and potentially cause damage to user equipment.

But voltages at end user premises are not easily detected, in part because voltages can vary from end point to end point and therefore require detection at each end point. Advanced Metering Infrastructure (AMI) devices, or smart meters, typically used for billing purposes, can also gather voltage information, obviating a need to send a technician to obtain measurements. But existing solutions that process AMI measurements are unable to validate AMI meter voltage ratings.

Hence, solutions are needed to automatically validate meter voltage ratings using AMI measurements.

SUMMARY

Certain aspects and features include a system and method for determining a voltage meter rating for a utility meter connected to a distribution system via one or more distribution lines. The method accesses voltage measurements provided by a meter. Each measurement represents a voltage at a different time interval. The method filters the voltage measurements to remove any voltage measurements that fall outside a voltage range for the distribution line. The method further determines a measured voltage rating from a set of candidate voltage ratings for the meter by performing additional steps. The additional steps include determining a commonly recurring voltage from the filtered voltage measurements, comparing the commonly recurring voltage to the candidate voltage ratings, calculating, for each candidate voltage rating, a difference between the commonly recurring voltage and the respective feasible rating; and selecting one of the candidate voltage ratings as the measured voltage rating based on the difference between the commonly recurring voltage and the measured voltage rating. The method further accesses a stored voltage rating for the meter. The method compares the stored voltage rating for the meter and the measured voltage rating to determine a confidence level for the measured voltage rating. When the confidence level for the measured voltage rating is below a confidence threshold, the method uses the stored voltage rating to maintain the distribution system.

These illustrative examples are mentioned not to limit or define the disclosure, but to provide examples to aid understanding thereof. Additional examples and further description are provided in the Detailed Description.

BRIEF DESCRIPTION OF THE FIGURES

These and other features, aspects, and advantages of the present disclosure are better understood when the following Detailed Description is read with reference to the accompanying drawings, where.

DETAILED DESCRIPTION

Aspects of the present invention relate to systems and methods that accurately and reliably detect a configuration and operation of advanced metering devices installed at endpoint locations on a power distribution network. More specifically, certain aspects use end point meter measurements to determine a commonly recurring voltage for the meter and based on the commonly recurring voltage and a set of candidate voltage ratings, determine a measured voltage rating. Certain aspects then determine a correctness for stored voltage ratings that are retrieved from a central system. If the stored voltage rating is inaccurate, the measured voltage rating can be used to maintain the power distribution system. If appropriate, the stored voltage rating can be updated to match the measured voltage rating, ensuring that functions such as maintaining a functioning distribution system, planning, analytics, and power outage management use an accurate meter voltage rating.

Figure 1:
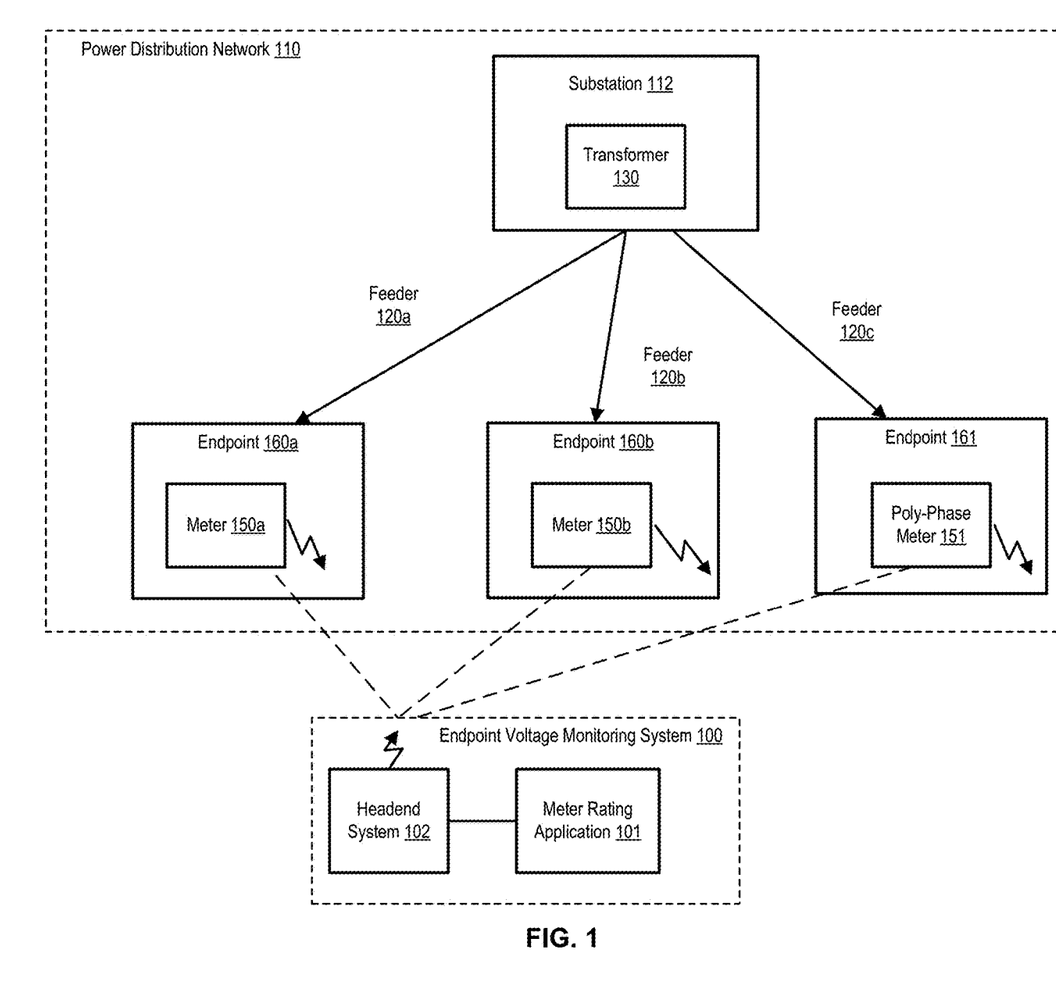
FIG. 1 illustrates an exemplary physical topology of a power distribution network showing devices at various points on the network.

FIG. 1 illustrates an exemplary physical topology of a portion of a power distribution network showing devices at various points on the network. More specifically, FIG. 1 depicts power distribution network 110, which distributes power to multiple endpoints, and monitoring system 100 which receives measurements from meters at the endpoints and determines whether the meters are properly rated.

Power distribution network 110 includes substation 112, feeders 120-a-c, endpoint 160a, endpoint 160b, and endpoint 161. Substation 112 distributes one or more phases of electricity received from an electricity source to feeders 120a-c, which in turn distribute power to the endpoints. Examples of electricity sources are a coal plant, a wind turbine installation, or a solar panel installation.

Substation 112 can include substation transformer 130 that can step down the received voltage and output a lower voltage appropriate for distribution to the endpoints. Endpoint 160a includes meter 150a, endpoint 160b includes meter 150b, and endpoint 161 includes poly-phase meter 151. In particular, substation 112 distributes a single phase of power to endpoint 160a, the same or a different single phase of power to endpoint 160b, and three phases of power to endpoint 161. Meters 150a-b, typically installed at customer premises, are configured to measure parameters such as voltage on a single phase, whereas poly-phase meter 151 is configured to measure power of multiple phases.

Figure 6:
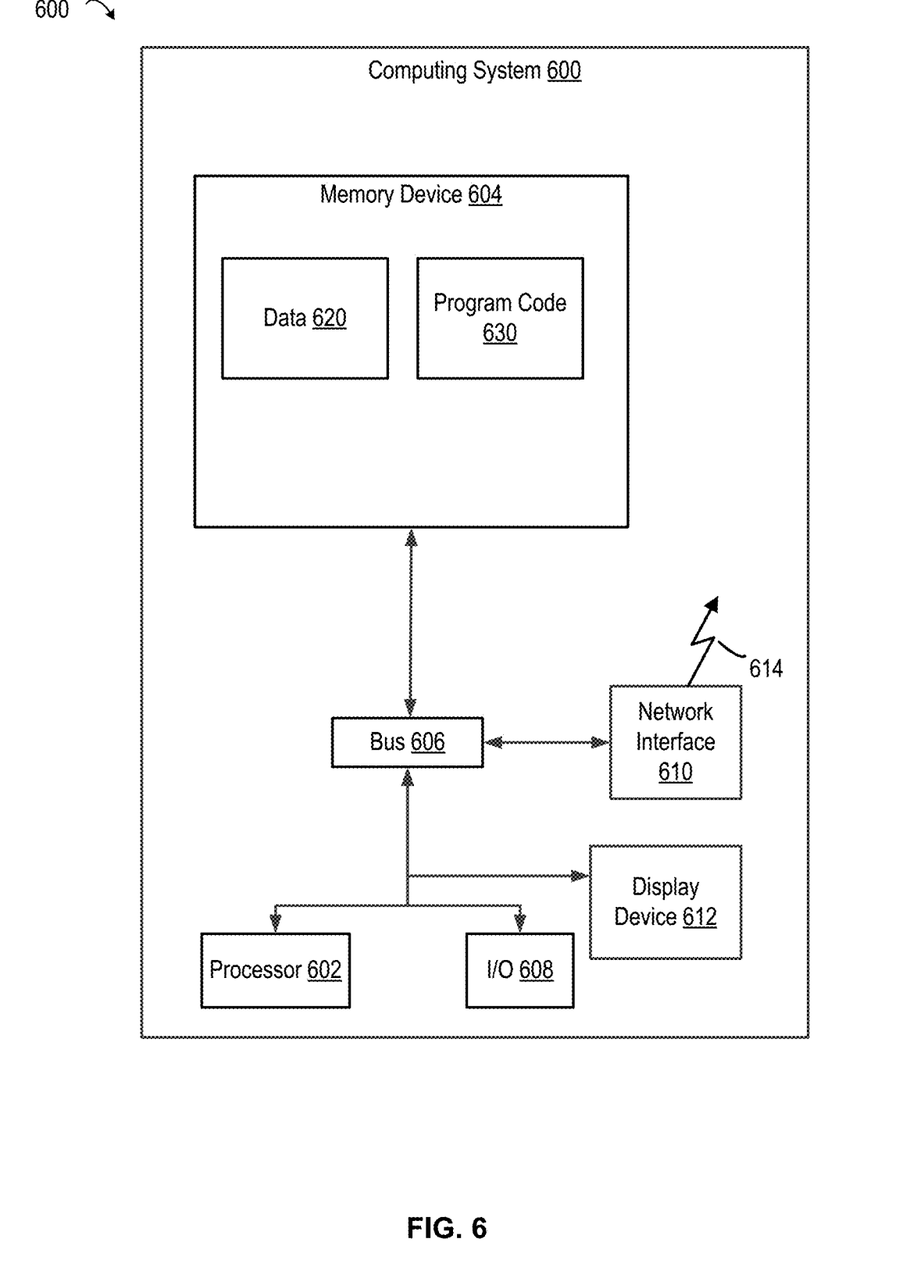
FIG. 6 illustrates an exemplary computing device used for a meter rating application.

Endpoint voltage monitoring system 100 includes meter rating application 101 and headend system 102. Meter rating application 101 executes on a computing device, an example of which is depicted in FIG. 6. Meter rating application 101 determines a voltage rating of meters 150a, 150b, and 151 based on metering measurements such as voltage, power consumption, etc., of the meters, either directly from the meter itself (e.g., via a network) or through an intermediary system such as an aggregator (not shown) that collects and combines metering measurements from multiple meters.

In an example, meter rating application 101 receives, via headend system 102, multiple voltage measurements obtained by meter 150a. Each measurement represents a different time interval. As explained further herein, meter rating application 101 filters out voltages that are aberrations (e.g., very high or very low) and determines a commonly recurring voltage of the meter. Based on a set of candidate voltage ratings and the commonly recurring voltage, meter rating application 101 determines a measured voltage rating.

Meter rating application 101 accesses a stored voltage rating for meter 150a (e.g., from central system) and compares it with the measured voltage rating. If the stored voltage rating and the measured voltage rating do not match, then the meter rating application 101 determines a confidence level for the measured voltage rating. Based on the confidence rating being above a confidence threshold, meter rating application 101 can use the measured voltage rating, rather than the stored voltage rating, to maintain the power distribution system.

Figure 2:
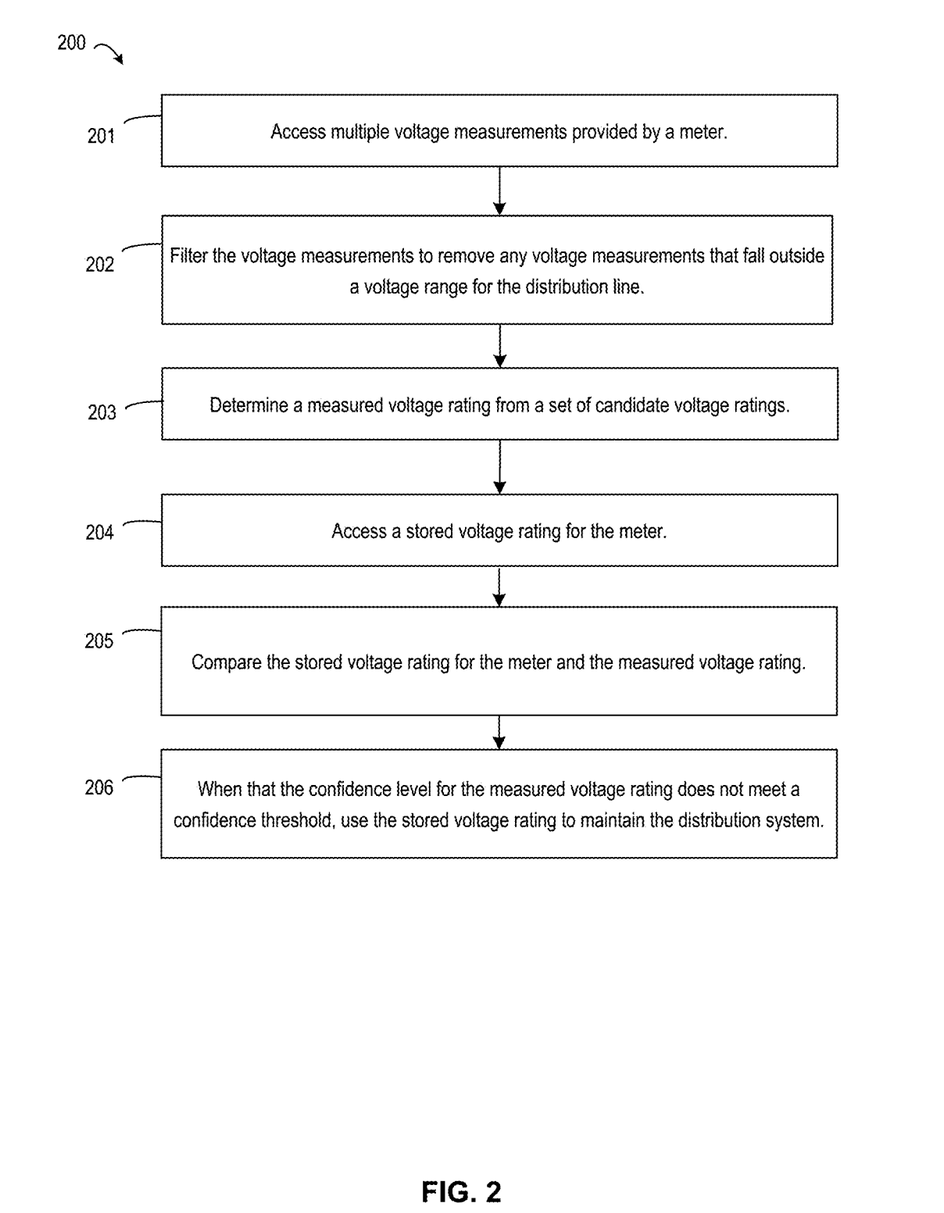
FIG. 2 is a flowchart illustrating an exemplary method for determining a rated voltage of an AMI meter, according to an aspect.

In further aspects, meter rating application 101 can detect that an entry corresponding to the meter is missing from the central system, or whether a meter is detecting an over- or under-voltage condition. FIG. 2 explains an example of a process performed by meter rating application 101 in more detail.

FIG. 2 is a flowchart illustrating an exemplary method 200 for determining a rated voltage of an AMI meter, according to an aspect. For example purposes only, method 200 is discussed with respect to FIG. 1, specifically, meter 150a and endpoint 160a.

At block 201, method 200 involves accessing multiple voltage measurements provided by a meter. Each of the multiple voltage measurements can represent a voltage at a different time interval. For example, headend system 102 receives voltage measurements from meter 150a, which measures a voltage at endpoint 160a, from various intervals during a period of time. For example, meter rating application 101 obtains voltage measurements from meter 150a over a 24-hour period at measurement intervals of one hour (for a total of 24 measurements).

At block 202, method 200 involves filtering the voltage measurements to remove any voltage measurements that fall outside a voltage range for the distribution line. Examples of out-of-range voltages include reads with partial power outages, reads with short or long intervals or reads with complete power outages. Meter rating application 101 accesses a set of candidate voltage ratings, e.g., from a system such as a CIS or other database. Examples of candidate voltage ratings are 120, 208, 240, 277, and 480 Volts.

Continuing the example, meter rating application 101 determines that meter 150a has an expected voltage range of 110-130 Volts and filters out voltages that outside this range (i.e. are unreasonable based on the particular configuration of distribution network). For example, a set of voltages obtained at block 201 includes {120, 124, 119, 119, 120, 121, 120, 140, 10, 119, . . . and 121}. Meter rating application 101 disregards the values of 140 and 10 Volts, leaving a set of voltages that includes {120, 124, 119, 119, 120, 121, 120, 119, . . . and 121}. As can be seen, each voltage in this reduced set of voltages is approximately 120 Volts. Normal fluctuations from 120 Volts can be expected and are accounted for by meter rating application 101.

In an aspect, removed erroneous values can be discarded or replaced if a complete set of measurements are required. For example, meter rating application 101 replaces a disregarded value with an average of two adjacent values or with another value. Meter rating application 101 can also replace discarded values with a mean, median, or mode.

In another aspect, meter rating application 101 can analyze measurements from a larger time frame. For example, if meter rating application 101 determines that the voltage measurements are erratic or inconsistent, then meter rating application 101 may wait an additional period of time and determine whether the measurements have become more consistent. Meter rating application 101 can then replace the set of measurements with new measurements, or may gather additional measurements for a larger set of measurements.

At block 203, method 200 involves determining a measured voltage rating from a set of candidate voltage ratings. Example candidate voltage ratings include values such as 120, 208, 240, 277, and 480 Volts. Candidate voltage ratings can be identical to, similar to, or different from the expected line distribution voltages discussed with respect to block 202. Because a meter can function in over- and under-voltage situations, a particular meter can be rated for higher and lower than an expected voltage. A voltage rating can be higher or lower than a typical expected voltage value. For example, a meter that is configured to measure a 120 Volt circuit can have a rating that is 100-150 Volts.

First, meter rating application 101 determines a commonly recurring voltage from the filtered voltage measurements. As used herein, "commonly recurring voltage" refers to a voltage that occurs on a regular basis. Different methods can be used to calculate a recurring voltage. For example, a mode, a median, or a mean can be used as a recurring voltage. In some aspects, a recurring voltage is calculated based on a statistical averaging of the filtered voltage measurements.

In the case that the filtered voltage measurements include multiple modes, then meter rating application 101 can select a largest mode from the modes as the commonly recurring voltage. Further, if the two largest modes include an identical number of filtered voltage measurements, then meter rating application 101 can use an average of the two largest modes. Meter rating application 101 can also determine other statistics such as mean, mode, median, or standard deviation, which can be used at block 203 or elsewhere.

Continuing the example, given the values obtained at block 202, which are {120, 124, 119, 119, 120, 121, 120, 140, 10, 119, . . . and 121}, meter rating application 101 determines that 119 is the commonly recurring voltage.

Second, meter rating application 101 compares the commonly recurring voltage to a set of candidate voltage ratings. Candidate voltage ratings can include commonly acceptable voltages such as 120, 208, 240, 277, and 480.

Third, meter rating application 101 calculates, for each candidate voltage rating, a difference between the commonly recurring voltage and the respective candidate voltage rating. Continuing the example, meter rating application 101 determines a difference between the commonly recurring voltage (119 Volts) and the candidate voltage ratings {120, 208, 240, 277, and 480}. The differences are {1, 121, 89, 177, and 361}. As can be seen, the smallest difference is 1 Volt and is relative to the candidate voltage rating of 120 Volts.

Fourth, meter rating application 101 selects a candidate voltage rating with the smallest difference as the measured voltage rating. Continuing the example, meter rating application 101 selects a candidate voltage rating of 120 Volts.

In an aspect, meter rating application 101 can perform faulty meter detection. A faulty meter is a meter with hardware defects or a meter with loose wiring connections. Different approaches can be used. In another aspect, if meter rating application 101 determines a commonly recurring voltage at a particular meter that is infeasible based on the set of candidate voltage ratings (e.g., is outside a threshold of all the candidate voltage ratings), meter rating application 101 may determine that the particular meter is faulty. If the meter rating application 101 determines a commonly recurring voltage of one or two phases at a poly phase meter that is infeasible based on the set of candidate voltage ratings (e.g., is outside a threshold of all the candidate voltage ratings), meter rating application 101 may determine that the particular meter is faulty.

At block 204, method 200 involves accessing a stored voltage rating for the meter. Each meter can have an associated stored voltage rating. Meter rating application 101 can access a set of stored voltage ratings that includes a stored rating for one or more of the meters, e.g., meters 150a, 150b, or 151. Continuing the example, meter rating application 101 accesses a stored voltage rating of 240 Volts for meter 150a.

In an aspect, meter rating application 101 detects meter ratings that are missing from a database of meter ratings. The stored voltage rating for a meter can also be absent, for example, due to a missing entry in a database. If a stored voltage rating is not present for a meter, then meter rating application 101 can flag the issue for later follow-up, or can populate the stored voltage rating from the measured rating (as determined at block 205).

At block 205, method 200 involves comparing the stored voltage rating and the measured voltage rating. If the two ratings do not match, meter rating application 101 determines a confidence level for the measured voltage rating. A confidence level represents a probability that the measured voltage rating is accurate. Confidence levels can be high or low. A high confidence level in the measured voltage rating indicates a strong likelihood that the measured meter rating is correct. But a low confidence level in the measured voltage rating indicates that the measured voltage rating could be incorrect and further analysis for more time intervals is required to be certain of the correctness of the measured voltage rating.

Meter rating application 101 determines a confidence rating by determining whether any of the filtered voltage measurements are within a range around the stored voltage rating. If at least one of the filtered voltage measurements is within the range, then meter rating application 101 can set the confidence level to reflect a lower confidence in an accuracy of the measured voltage rating. In this case, meter rating application 101 can perform additional analysis such as executing blocks 201-205 again to obtain updated measurements. If none of the filtered voltage measurements are within the range around the stored voltage rating, then meter rating application 101 can set the confidence level to reflect a higher confidence in an accuracy of the measured voltage rating.

Continuing the example, meter rating application 101 compares the stored voltage rating, 240 Volts, with the measured voltage rating, 120 Volts. Because the commonly recurring voltages (which in this case, are around 120 Volts) and the measured voltage rating are within a threshold, meter rating application 101 determines that the measured rating is likely to be correct, and by extension, that the stored rating is likely incorrect.

Continuing the example, based on the analysis that shows a commonly recurring voltage of 119 Volts, which led to a measured voltage rating of 120 Volts, the stored voltage rating of 240 Volts is likely incorrect. Consequently, meter rating application 101 determines that none of the filtered voltage measurements are within the range around the stored voltage rating and therefore assigns a high confidence level to the measured meter rating and by extension concludes, that the stored rating is likely incorrect. An incorrect stored voltage rating can exist because a technician entered an incorrect rating, for example, because a premises previously receiving service at 240 Volts was updated with a new meter corresponding to 120 Volt service, but the stored voltage rating was not updated.

At block 206, when the confidence level for the stored voltage rating does not meet a confidence threshold, method 200 involves using the measured voltage rating to maintain the distribution system. Accordingly, further analysis and decisions taken by headend system 102 and meter rating application 101 are based on the measured voltage application rather than the stored voltage rating for the meter.

In yet another aspect, meter rating application 101 can update an incorrect stored meter rating if a confidence level of the measured meter rating is above a threshold. For example, if meter rating application 101 determines that a measured meter rating is 240 Volts with a high confidence, meter rating application 101 may update a stored meter rating of 120 Volts with 240 Volts.

Confidence levels can be updated. For example, if over time, meter rating application 101 obtains and analyzes additional measurements, a confidence level can be updated. For example, subsequent to determining a low confidence level, meter rating application 101 may continue to monitor measured voltages. If the updated confidence level rises above a threshold, then meter rating application 101 may take an action.

In an aspect, meter rating application 101 can detect an over or an under-voltage condition. For example, responsive to determining that the commonly recurring voltage is above a threshold maximum voltage for the measured rating, meter rating application 101 can identify the meter as indicating an over-voltage condition. Similarly, when meter rating application 101 determines that the commonly recurring voltage is below a threshold minimum voltage, meter rating application 101 identifies the meter as indicating an under-voltage condition. For example, meter rating application 101 determines a measured voltage rating of 277 Volts with a confidence level of high and a commonly recurring voltage of 302 Volts. Responsive to determining that a commonly recurring voltage of 302 Volts is above a maximum threshold voltage for a 277 Volt rating, meter rating application 101 detects an over-voltage condition.

Figure 3:
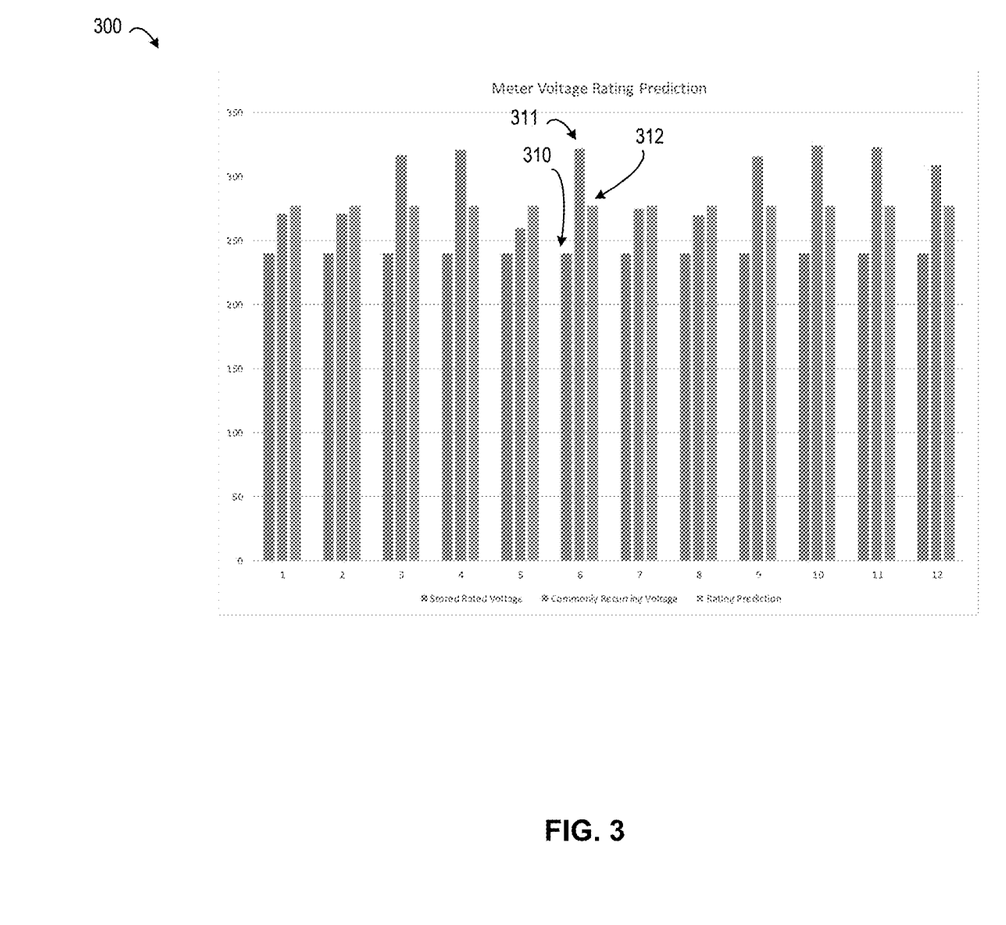
FIG. 3 is a graph indicating examples of predictions of meter voltages, according to an aspect.

FIG. 3 is a graph indicating examples of predictions of meter voltages, according to an aspect. FIG. 3 depicts graph 300, which illustrates stored voltage ratings, and a prediction. The measurements in graph 300 are also shown in Table 1. As shown in Table 1, each entry includes a meter identifier, a stored voltage rating, an identified recurring voltage, a rating prediction, a difference between the commonly recurring voltage rating and the measured voltage rating, and a determined confidence level in the difference.

TABLE 1

| Meter ID | Stored Voltage Rating | Commonly Recurring Voltage | Measured Voltage Rating | Difference (Commonly Recurring Voltage-Measured Voltage Rating) | Confidence |
|---|---|---|---|---|---|
| 1 | 240 | 271 | 277 | −6 | High |
| 2 | 240 | 271 | 277 | 6 | High |
| 3 | 240 | 317 | 277 | 40 | High |
| 4 | 240 | 371 | 277 | 44 | High |
| 5 | 240 | 260 | 277 | −17 | High |
| 6 | 240 | 322 | 277 | 45 | High |
| 7 | 240 | 275 | 277 | −2 | High |
| 8 | 240 | 270 | 277 | −7 | High |
| 9 | 240 | 316 | 277 | 39 | High |
| 10 | 240 | 324 | 277 | 47 | High |
| 11 | 240 | 323 | 277 | 46 | High |
| 12 | 240 | 309 | 277 | 32 | High |

In particular, FIG. 3 illustrates twelve sets of ratings, each for a particular meter. Each set includes an example stored voltage rating 310, a commonly recurring voltage rating, and a measured voltage rating. For example, FIG. 3 includes exemplary stored voltage rating 310, commonly recurring voltage 311, and measured voltage rating 312, for the meter with meter ID 6 as depicted in Table 1.

As can be seen, for meter ID 6, meter rating application 101 has determined a recurring voltage of 322, but a prediction of 277, a stored voltage rating of 240, and a difference of 45 Volts between the prediction and the stored rating value. Meter rating application 101 determines that the measured voltage rating is accurate and the stored rating is inaccurate because there were not any filtered voltage measurements around the stored voltage rating (240 volts). There is no filtered voltage measurement in the range of (240−10% of 240, 240+5% of 240) which is the range between which the voltage should typically swing for a 240 rated (stored rating) meter. Therefore even though the difference between the commonly recurring voltage and the measured rating is 45 Volts, meter rating application 101 determines, with a high confidence, that the measured voltage rating is accurate and stored rating is inaccurate.

Figure 4:
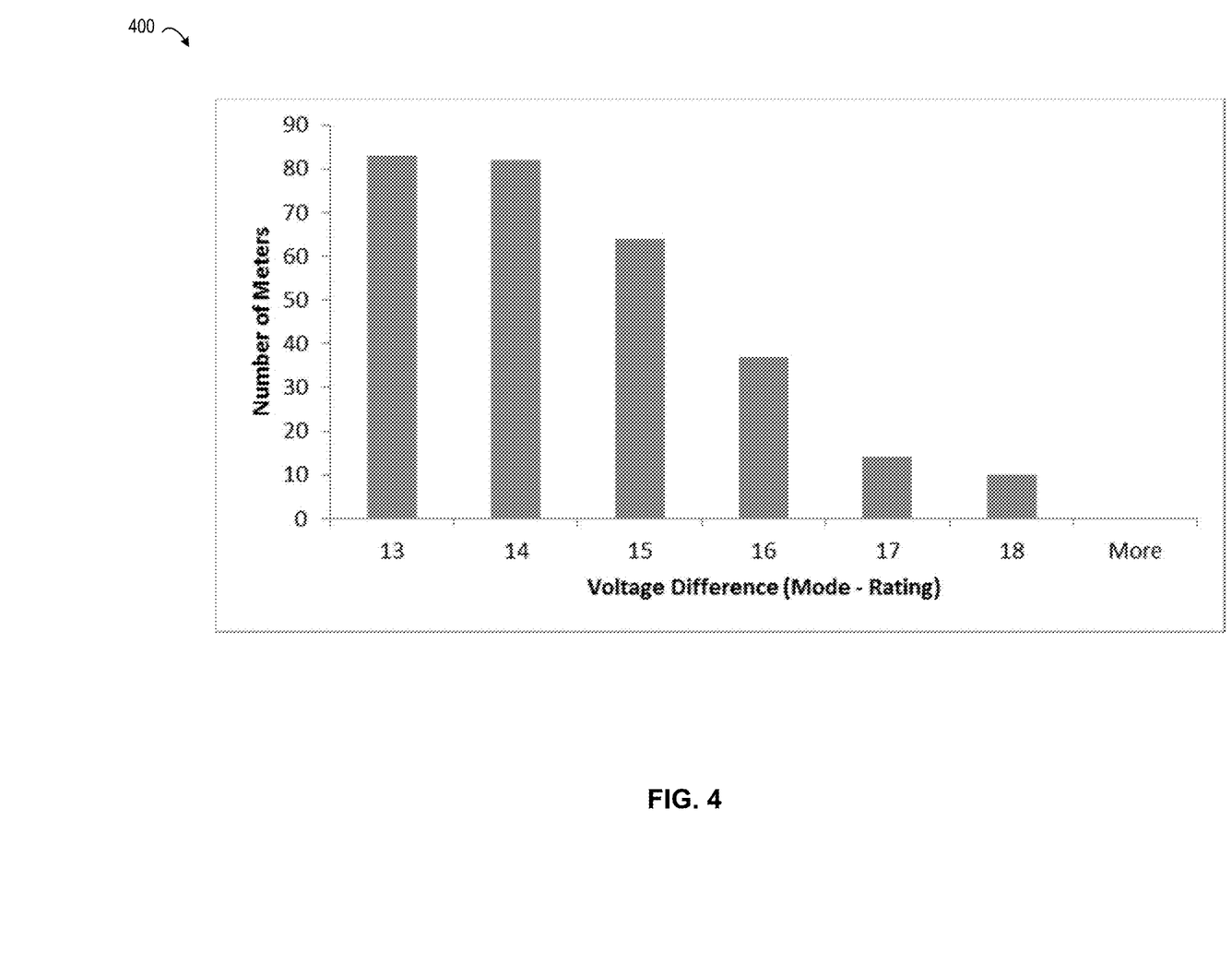
FIG. 4 is a graph indicating examples of frequency distributions of meters that have specific differences between predictions of meter voltages and rated meter voltages, according to an aspect.

FIG. 4 is a graph indicating examples of frequency distributions of meters that have specific differences between commonly recurring voltage and measured voltage rating, according to an aspect. FIG. 4 depicts graph 400. Graph 400 illustrates that in the particular set of meters, over 80 have a voltage difference of 13 volts, over 80 have a voltage difference of 13 volts, over 60 have a voltage difference of 15 volts, nearly 40 have a voltage difference of 16 volts, over 10 have a voltage difference of 17 volts, and approximately 10 have a voltage difference of 18 volts.

Table 2 depicts the measurements for the meters used in FIG. 4, all of which have possible over-voltage conditions (when the commonly recurring voltage is greater than the measured voltage). When the stored voltage rating and measured voltage rating match for a meter, the meter can be flagged for further analysis such as detection of over voltage and under voltage conditions. For example, if the commonly recurring voltage is outside an ideal range of Rated meter voltage−5% of Rated meter Voltage, an under-voltage condition exists, and if Rated meter Voltage+5% of Rated meter Voltage, then an over-voltage condition exists.

TABLE 2

| Meter ID | Stored Voltage Rating | Commonly Recurring Voltage | Measured Voltage Rating | Difference (commonly recurring voltage-measured voltage rating) |
|---|---|---|---|---|
| 1 | 240 | 253 | 240 | 13 |
| 2 | 240 | 256 | 240 | 16 |
| 3 | 240 | 257 | 240 | 17 |
| 4 | 240 | 254 | 240 | 14 |
| 5 | 240 | 253 | 240 | 13 |
| 6 | 240 | 255 | 240 | 15 |
| 7 | 240 | 255 | 240 | 15 |
| 8 | 240 | 256 | 240 | 16 |
| 9 | 240 | 254 | 240 | 14 |
| 10 | 240 | 254 | 240 | 14 |
| 11 | 240 | 253 | 240 | 13 |
| 12 | 240 | 255 | 240 | 15 |
| 13 | 240 | 253 | 240 | 13 |
| 14 | 240 | 255 | 240 | 15 |
| 15 | 240 | 254 | 240 | 14 |
| 16 | 240 | 254 | 240 | 14 |
| 17 | 240 | 255 | 240 | 15 |
| 18 | 240 | 253 | 240 | 13 |
| 19 | 240 | 255 | 240 | 15 |
| 20 | 240 | 256 | 240 | 16 |
| 21 | 240 | 255 | 240 | 15 |
| 22 | 240 | 255 | 240 | 15 |
| 23 | 240 | 255 | 240 | 15 |
| 24 | 240 | 254 | 240 | 14 |
| 25 | 240 | 253 | 240 | 13 |
| 26 | 240 | 255 | 240 | 15 |
| 27 | 240 | 257 | 240 | 17 |
| 28 | 240 | 253 | 240 | 13 |
| 29 | 240 | 254 | 240 | 14 |

Meter rating application 101 can detect a configuration and operation of poly-phase meters (meters that detect voltages on a distribution system with multiple phases) installed at endpoint locations on a power distribution network. For example, a customer premises may receive two 120 Volt distribution lines so that when connected, the total voltage is 240 Volt, permitting the use of 240 Volt appliances such as dryers.

To detect a configuration or operation of a poly-phase meter, meter rating application 101 can follow a process similar to method 200. Meter rating application 101 determines that the meter is poly-phase. Each phase of a poly-phase system can have different voltages for example due to unbalanced load. Consequently, meter rating application 101 executes the steps described in method 200 for each phase of a poly-phase system.

Figure 5:
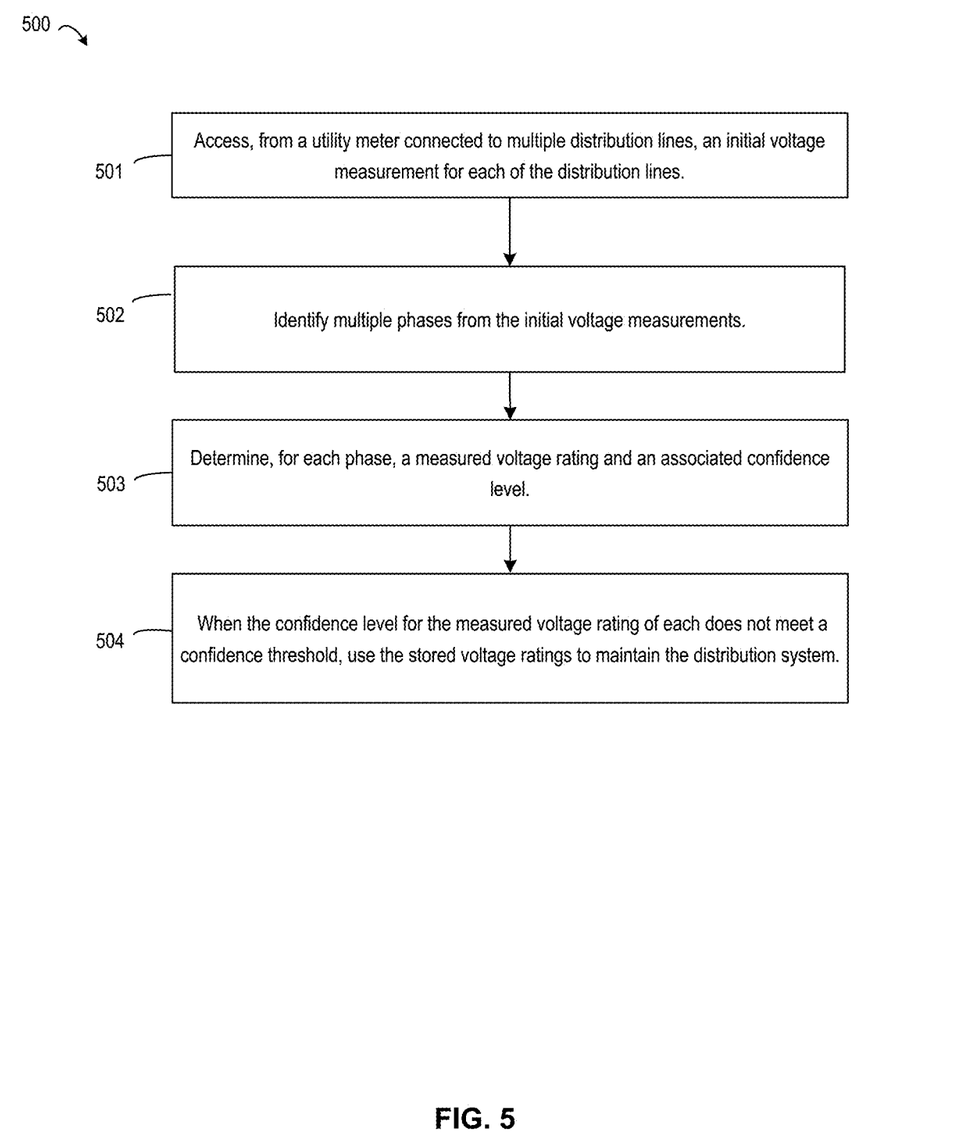
FIG. 5 is a flowchart illustrating an exemplary method for distinguishing a single-phase meter from a poly-phase meter, according to an aspect.

FIG. 5 is a flowchart illustrating an exemplary method 500 for distinguishing a single-phase meter from a poly-phase meter, according to an aspect.

At block 501, method 500 involves accessing, from a utility meter connected to multiple distribution lines, an initial voltage measurement for each of the distribution lines. In an aspect, a smart meter such as an AMI meter uses different channels to communicate measured voltages on different phases of power. Information for each channel can be transmitted separately from the meter to a central database. But some channels can remain unused (e.g., if there are more channels than phases). For example, three channels (A, B, and C) can exist but only two channels are being detected by the meter. Moreover, sometimes, a meter system or a CIS system may be configured to use an incorrect set of channels. For example, a meter can send back voltages for a first phase on channel A and for a second phase on channel C while a central system is configured to expect channels A and B to be populated with measurements. Meter rating application 101 can isolate and correct such errors by determining measured voltage ratings and comparing voltage ratings for an expected set of channels.

At block 502, method 500 involves identifying multiple phases from the initial voltage measurements. For example, for a given time period, meter rating application 101 can determine more than one phase exists at an endpoint. Typically, a meter sends back the voltage at each phase and the average of voltage on each phase to the central system. So for a single phase meter, the phase voltage is always equal to the average voltage because there is only one phase. On the other hand, for a poly phase meter, the probability of the voltage at one phase of being equal to the average of all the phases voltage is small because the distribution system is unbalanced. Therefore, meter rating application 101 compares the voltage measurement coming from a first phase to the average voltage of all the phases for a threshold number of time intervals. If no match exists, then meter rating application 101 identifies the meter as a poly phase meter.

At block 503, method 500 involves determining, for each phase, a measured voltage rating and a confidence level of the measured voltage rating. At block 503, meter rating application 101 performs substantially similar steps as described in blocks 201-206 of method 200.

At block 504, method 500 involves using the stored voltage ratings to maintain the distribution system when the confidence level for the measured voltage rating of each phase does not meet a confidence threshold. Meter rating application 101 can require that all or a threshold number of phases have a high confidence reflecting the corresponding measured voltage.

In an aspect, meter rating application 101 can determine that one or more phases have incorrect ratings in a central system, and can update such ratings. Similarly, meter rating application 101 can determine an over- or under-voltage condition on one or more of the phases and take action or flag the particular phase for further analysis. For example, Table 3 illustrates exemplary results from performing method 500 on a set of poly phase meters. More specifically, Table 3 shows, a set of meters identified for subsequent analysis based on an identified potential over-voltage. Table 3 includes, for each determined channel of each meter, a stored voltage rating, a recurring voltage, a measured voltage, a difference between the stored voltage rating, and the measured voltage rating.

TABLE 3

| Meter Identifier | Phase | Stored Voltage Rating | Recurring Voltage | Measured Voltage | Difference |
| --- | --- | --- | --- | --- | --- |
| 1 | A | 120 | 129 | 120 | 9 |
| 2 | B | 120 | 127 | 120 | 7 |
| 3 | C | 120 | 127 | 120 | 7 |
| 4 | B | 120 | 128 | 120 | 8 |
| 5 | C | 120 | 127 | 120 | 7 |
| 6 | C | 120 | 127 | 120 | 7 |
| 7 | C | 120 | 128 | 120 | 8 |
| 8 | A | 120 | 127 | 120 | 7 |
| 9 | C | 120 | 128 | 120 | 8 |
| 10 | C | 120 | 128 | 120 | 8 |
| 11 | A | 120 | 127 | 120 | 7 |
| 12 | B | 120 | 127 | 120 | 7 |
| 13 | A | 120 | 127 | 120 | 7 |
| 14 | B | 120 | 128 | 120 | 8 |
| 15 | C | 120 | 128 | 120 | 8 |
| 16 | A | 120 | 127 | 120 | 7 |
| 17 | B | 120 | 127 | 120 | 7 |
| 18 | C | 120 | 127 | 120 | 7 |
| 19 | B | 120 | 127 | 120 | 7 |
| 20 | A | 120 | 131 | 120 | 11 |
| 21 | B | 120 | 131 | 120 | 11 |
| 22 | C | 120 | 129 | 120 | 9 |
| 23 | A | 120 | 127 | 120 | 7 |
| 24 | A | 120 | 127 | 120 | 7 |
| 25 | B | 120 | 127 | 120 | 7 |

In a further aspect, meter rating application 101 assigns confidence ratings to the measured voltage ratings. Table 4 illustrates stored ratings flagged as incorrect for poly-phase meters. More specifically, Table 4 shows, for each meter, phase voltage measurements on one or more channels. For each channel, table 4 includes a stored voltage rating, a commonly recurring voltage, a measured voltage, a difference between the stored voltage rating and the measured voltage rating, and a confidence level of the difference. For example, data in Table 4 shows that for meter identified by 100, phase C, meter rating application 101 has determined a high confidence in a difference between the measured voltage rating of 208 Volts and the stored voltage rating of 120 Volts. Based on this high confidence, the stored meter rating of 120 Volts is likely inaccurate.

TABLE 4

| Meter Identifier | Phase | Stored Voltage Rating | Commonly Recurring Voltage | Measured Voltage Rating | Difference | Confidence |
| --- | --- | --- | --- | --- | --- | --- |
| 100 | C | 120 | 212 | 208 | 4 | High |
| 101 | C | 120 | 212 | 208 | 4 | High |
| 102 | A | 208 | 121 | 120 | 1 | High |
| 102 | B | 208 | 122 | 120 | 2 | High |
| 102 | C | 208 | 121 | 120 | 1 | High |
| 103 | C | 120 | 218 | 208 | 10 | High |
| 104 | C | 120 | 213 | 208 | 5 | High |
| 105 | C | 120 | 212 | 208 | 4 | High |
| 106 | C | 120 | 213 | 208 | 5 | High |
| 107 | C | 120 | 209 | 208 | 1 | High |
| 108 | C | 120 | 213 | 208 | 5 | High |
| 109 | C | 120 | 210 | 208 | 2 | High |
| 110 | C | 120 | 213 | 205 | 5 | High |
| 111 | C | 120 | 212 | 208 | 4 | High |
| 112 | B | 277 | 255 | 240 | 15 | Low |
| 112 | C | 277 | 249 | 240 | 9 | Low |
| 113 | C | 120 | 210 | 208 | 2 | High |
| 114 | C | 120 | 213 | 208 | 5 | High |

TABLE 4-continued

| Meter Identifier | Phase | Stored Voltage Rating | Commonly Recurring Voltage | Measured Voltage Rating | Difference | Confidence |
|---|---|---|---|---|---|---|
| 115 | C | 120 | 213 | 208 | 5 | High |
| 116 | C | 120 | 212 | 208 | 4 | High |
| 117 | C | 120 | 212 | 208 | 4 | High |
| 118 | C | 120 | 209 | 208 | 1 | High |
| 119 | C | 120 | 212 | 208 | 4 | High |
| 120 | C | 120 | 212 | 208 | 4 | High |
| 121 | C | 120 | 210 | 208 | 2 | High |
| 122 | C | 120 | 209 | 208 | 1 | High |
| 123 | A | 208 | 281 | 277 | 4 | High |
| 123 | B | 208 | 275 | 277 | −2 | High |

Exemplary Computing Devices

FIG. 6 illustrates an exemplary computing device used for a meter rating application, according to certain aspects of the present disclosure. Any suitable computing system may be used for performing the operations described herein, such as implementing meter rating application 101. The depicted example of a computing device 600 includes a processor 602 communicatively coupled to one or more memory devices 604. The processor 602 executes computer-executable program code 630 stored in a memory device 604, accesses data 620 stored in the memory device 604, or both. Examples of the processor 602 include a microprocessor, an application-specific integrated circuit ("ASIC"), a field-programmable gate array ("FPGA"), or any other suitable processing device. The processor 602 can include any number of processing devices or cores, including a single processing device. The functionality of the computing device may be implemented in hardware, software, firmware, or a combination thereof.

The memory device 604 includes any suitable non-transitory computer-readable medium for storing data, program code, or both. A computer-readable medium can include any electronic, optical, magnetic, or other storage device capable of providing a processor with computer-readable instructions or other program code. Non-limiting examples of a computer-readable medium include a flash memory, a ROM, a RAM, an ASIC, or any other medium from which a processing device can read instructions. The instructions may include processor-specific instructions generated by a compiler or an interpreter from code written in any suitable computer-programming language, including, for example, C, C++, C#, Visual Basic, Java, or scripting language.

The computing device 600 may also include a number of external or internal devices, such as input or output devices. For example, the computing device 600 is shown with one or more input/output ("I/O") interfaces 608. An I/O interface 608 can receive input from input devices or provide output to output devices. One or more busses 606 are also included in the computing device 600. The bus 606 communicatively couples one or more components of a respective one of the computing device 600.

The computing device 600 executes program code 630 that configures the processor 602 to perform one or more of the operations described herein. For example, the program code 630 causes the processor to perform the operations described in FIG. 2.

The computing device 600 also includes a network interface device 610. The network interface device 610 includes any device or group of devices suitable for establishing a wired or wireless data connection to one or more data networks. The network interface device 610 may be a wireless device and have an antenna 614. The computing device 600 can communicate with one or more other computing devices implementing the computing device or other functionality via a data network using the network interface device 610.

The computing device 600 can also include a display device 612. Display device 612 can be a LCD, LED, touch-screen or other device operable to display information about the computing device 600. For example, information could include an operational status of the computing device, network status, etc.

General Considerations

While the present subject matter has been described in detail with respect to specific aspects thereof, it will be appreciated that those skilled in the art, upon attaining an understanding of the foregoing, may readily produce alterations to, variations of, and equivalents to such aspects. Accordingly, it should be understood that the present disclosure has been presented for purposes of example rather than limitation and does not preclude inclusion of such modifications, variations, and/or additions to the present subject matter as would be readily apparent to one of ordinary skill in the art.

What is claimed is:

1. A method for determining a voltage meter rating for a utility meter connected to a distribution system via a distribution line, the method comprising:
    accessing a plurality of voltage measurements provided by a meter, wherein each of the plurality of voltage measurements represents a voltage at a different time interval;
    filtering the plurality of voltage measurements to remove any voltage measurements that fall outside a voltage range for the distribution line;
    determining a measured voltage rating from a plurality of candidate voltage ratings for the meter by:
        determining a commonly recurring voltage from the filtered voltage measurements;
        comparing the commonly recurring voltage to each of the plurality of candidate voltage ratings;
        calculating, for each candidate voltage rating, a voltage difference between the commonly recurring voltage and the respective candidate voltage rating;
        selecting one of the plurality of candidate voltage ratings having a smallest voltage difference; and
        identifying the measured voltage rating as the selected one of the plurality of candidate voltage ratings;
    accessing a stored voltage rating for the meter;
    comparing the stored voltage rating for the meter and the measured voltage rating to determine a confidence level for the measured voltage rating; and when the confidence level for the measured voltage rating does not meet a confidence threshold, then associating, in the distribution system, the stored voltage rating with the meter.

2. The method of claim 1, wherein determining the commonly recurring voltage comprises:
when there is only one mode of the filtered voltage measurements, using the mode of the filtered voltage measurements as the commonly recurring voltage; and
when there are a plurality of modes of the filtered voltage measurements, selecting a largest mode from the plurality of modes of the filtered voltage measurements as the commonly recurring voltage.

3. The method of claim 1, wherein comparing the stored voltage rating for the meter and the measured voltage rating to determine a confidence level for the measured voltage rating comprises:
when the stored voltage rating for the meter and the measured voltage rating match, then determining whether any of the filtered voltage measurements exceed the stored voltage rating; and
when a threshold number of the filtered voltage measurements exceed the stored voltage rating by a predetermined threshold, then adjusting the confidence level to reflect a higher confidence in an accuracy of the measured voltage rating.

4. The method of claim 1, wherein comparing the stored voltage rating for the meter and the measured voltage rating to determine a confidence level for the measured voltage rating comprises:
when the stored voltage rating for the meter corresponds to a higher voltage than the measured voltage rating, then determining whether any of the filtered voltage measurements are within a range around the stored voltage rating;
when at least one of the filtered voltage measurements is within the range around the stored voltage rating, then adjusting the confidence level to reflect a higher confidence in an accuracy of the measured voltage rating; and
when none of the filtered voltage measurements is within the range around the stored voltage rating, then adjusting the confidence level to reflect a higher confidence in an accuracy of the measured voltage rating.

5. The method of claim 1, further comprising responsive to determining that the stored voltage rating for the meter is unavailable, identifying the meter as missing.

6. The method of claim 1, further comprising responsive to determining that the commonly recurring voltage is above an expected maximum voltage for a measured rating, identifying the meter as indicating an over-voltage condition.

7. The method of claim 1, further comprising responsive to determining that the commonly recurring voltage is below an expected minimum voltage, identifying the meter as indicating an under-voltage condition.

8. The method of claim 1, wherein the plurality of candidate voltage ratings comprises 120 Volts, 208 Volts, 240 Volts, 277 Volts, and 480 Volts.

9. A method for determining a voltage meter rating of a utility meter connected to a distribution system via multiple distribution lines, the method comprising:
accessing, from a utility meter connected to a plurality of distribution lines, an initial voltage measurement for each of the plurality of distribution lines;
responsive to identifying, from the initial voltage measurements, a plurality of phases, performing operations for each phase of the utility meter comprising:
accessing a plurality of voltage measurements for a particular phase, wherein each of the plurality of voltage measurements represents a voltage at a different time interval;
filtering the plurality of voltage measurements to remove any voltage measurements that fall outside a voltage range for the distribution line;
determining a measured voltage rating from a plurality of candidate voltage ratings for the phase of the utility meter by:
determining a commonly recurring voltage from the filtered voltage measurements;
comparing the commonly recurring voltage to each of the plurality of candidate voltage ratings;
calculating, for each candidate voltage rating, a difference between the commonly recurring voltage and the respective candidate voltage rating;
selecting one of the plurality of candidate voltage ratings having a smallest voltage difference between the commonly recurring voltage and the measured voltage rating; and
identifying the measured voltage rating as the selected one of the plurality of candidate voltage ratings;
accessing a stored voltage rating for the utility meter;
comparing the stored voltage rating for the utility meter and the measured voltage rating to determine a confidence level for the measured voltage rating; and
when the confidence level for the measured voltage rating of each phase of the plurality of phases does not meet a confidence threshold, then associating in the distribution system, the stored voltage rating with the utility meter.

10. The method of claim 9, wherein determining the commonly recurring voltage comprises:
when there is only one mode of the filtered voltage measurements, using the mode of the filtered voltage measurements as the commonly recurring voltage; and
when there are a plurality of modes of the filtered voltage measurements, selecting a largest mode from the plurality of modes of the filtered voltage measurements as the commonly recurring voltage.

11. The method of claim 9, wherein comparing the stored voltage rating for the utility meter and the measured voltage rating to determine a confidence level for the measured voltage rating comprises:
when the stored voltage rating for the utility meter and the measured voltage rating match, then determining whether any of the filtered voltage measurements exceed the stored voltage rating; and
when a threshold number of the filtered voltage measurements exceed the stored voltage rating by a predetermined threshold, then adjusting the confidence level to reflect a higher confidence in an accuracy of the measured voltage rating.

12. The method of claim 9, wherein comparing the stored voltage rating for the utility meter and the measured voltage rating to determine a confidence level for the measured voltage rating comprises:
when the stored voltage rating for the utility meter corresponds to a higher voltage than the measured voltage rating, then determining whether any of the filtered voltage measurements are within a range around the stored voltage rating;
when at least one of the filtered voltage measurements is within the range around the stored voltage rating, then adjusting the confidence level to reflect a higher confidence in an accuracy of the measured voltage rating; and when none of the filtered voltage measurements is within the range around the stored voltage rating, then adjusting the confidence level to reflect a higher confidence in an accuracy of the measured voltage rating.

13. The method of claim 9, further comprising responsive to determining that the stored voltage rating for the utility meter is unavailable, identifying the utility meter as missing.

14. The method of claim 9, further comprising responsive to determining that the commonly recurring voltage is above an expected maximum voltage for a measured rating, identifying the utility meter as indicating an over-voltage condition.

15. The method of claim 9, further comprising responsive to determining that the commonly recurring voltage is below an expected minimum voltage, identifying the utility meter as indicating an under-voltage condition.

16. The method of claim 9, wherein the plurality of candidate voltage ratings comprises 120 Volts, 177 Volts, 208 Volts, 240 Volts, 277 Volts, and 480 Volts.

17. A system for determining a voltage meter rating for a utility meter connected to a distribution system via a distribution line, the system comprising:
a non-transitory computer-readable medium storing computer-executable program instructions; and
a processing device communicatively coupled to the non-transitory computer-readable medium for executing the computer-executable program instructions, wherein executing the computer-executable program instructions configures the processing device to perform operations comprising:
accessing a plurality of voltage measurements provided by a meter, wherein each of the plurality of voltage measurements represents a voltage at a different time interval;
filtering the plurality of voltage measurements to remove any voltage measurements that fall outside a voltage range for the distribution line;
determining a measured voltage rating from a plurality of candidate voltage ratings for the meter by:
determining a commonly recurring voltage from the filtered voltage measurements;
comparing the commonly recurring voltage to each of the plurality of candidate voltage ratings;
calculating, for each candidate voltage rating, a voltage difference between the commonly recurring voltage and the respective candidate voltage rating;
selecting one of the plurality of candidate voltage ratings having a smallest voltage difference between the commonly recurring voltage and the measured voltage rating; and
identifying the measured voltage rating as the selected one of the plurality of candidate voltage ratings;
accessing a stored voltage rating for the meter;
comparing the stored voltage rating for the meter and the measured voltage rating to determine a confidence level for the measured voltage rating; and
when the confidence level for the stored voltage rating is below a confidence threshold, then associating in the distribution system, the stored voltage rating with the meter.

18. The system of claim 17, wherein determining the commonly recurring voltage comprises:
when there is only one mode of the filtered voltage measurements, using the mode of the filtered voltage measurements as the commonly recurring voltage; and
when there are a plurality of modes of the filtered voltage measurements, selecting a largest mode from the plurality of modes of the filtered voltage measurements as the commonly recurring voltage.

19. The system of claim 17, wherein comparing the stored voltage rating for the meter and the measured voltage rating to determine a confidence level for the measured voltage rating comprises:
when the stored voltage rating for the meter and the measured voltage rating match, then determining whether any of the filtered voltage measurements exceed the stored voltage rating; and
when a threshold number of the filtered voltage measurements exceed the stored voltage rating by a predetermined threshold, then adjusting the confidence level to reflect a higher confidence in an accuracy of the measured voltage rating.

20. The system of claim 17, wherein comparing the stored voltage rating for the meter and the measured voltage rating to determine a confidence level for the measured voltage rating comprises:
when the stored voltage rating for the meter corresponds to a higher voltage than the measured voltage rating, then determining whether any of the filtered voltage measurements are within a range around the stored voltage rating;
when at least one of the filtered voltage measurements is within the range around the stored voltage rating, then adjusting the confidence level to reflect a higher confidence in an accuracy of the measured voltage rating; and
when none of the filtered voltage measurements is within the range around the stored voltage rating, then adjusting the confidence level to reflect a higher confidence in an accuracy of the measured voltage rating.

* * * * *